(12) United States Patent
Huang et al.

(10) Patent No.: US 12,727,201 B2
(45) Date of Patent: Sep. 1, 2026

(54) THIN FILM TRANSISTOR, THIN FILM TRANSISTOR ARRAY SUBSTRATE AND METHOD OF MANUFACTURING THIN FILM TRANSISTOR

(71) Applicant: Century Technology (Shenzhen) Corporation Limited, Shenzhen (CN)

(72) Inventors: Chan-Kuan Huang, New Taipei (TW); Tuan-Fei Gu, Shenzhen (CN); Deng-Kai Chang, New Taipei (TW); Tai-Hsing Lee, New Taipei (TW)

(73) Assignee: Century Technology (Shenzhen) Corporation Limited, Shenzhen (CN)

( * ) Notice: Subject to any disclaimer, the term of this patent is extended or adjusted under 35 U.S.C. 154(b) by 531 days.

(21) Appl. No.: 18/132,825

(22) Filed: Apr. 10, 2023

(65) Prior Publication Data

US 2024/0194793 A1 Jun. 13, 2024

(30) Foreign Application Priority Data

Dec. 12, 2022 (CN) ......................... 202211600662.3

(51) Int. Cl.

| | |
|---|---|
| ***H01L 29/786*** | (2006.01) |
| ***G02F 1/1368*** | (2006.01) |
| ***H10D 30/01*** | (2025.01) |
| ***H10D 30/67*** | (2025.01) |
| ***H10D 86/40*** | (2025.01) |
| ***H10D 86/60*** | (2025.01) |

(52) U.S. Cl.

CPC ....... *H10D 30/6757* (2025.01); *G02F 1/1368* (2013.01); *H10D 30/0316* (2025.01); *H10D 30/0321* (2025.01); *H10D 30/6732* (2025.01); *H10D 30/6746* (2025.01); *H10D 86/421* (2025.01); *H10D 86/60* (2025.01)

(58) Field of Classification Search

CPC ........... H10D 30/6757; H10D 30/0316; H10D 30/0321; H10D 30/6732; H10D 30/6746; H10D 86/421; H10D 86/60; H10D 30/0314; H10D 30/6745; H10D 86/0229; H10D 62/111; H10D 62/124; H10D 86/425; G02F 1/1368

See application file for complete search history.

(56) References Cited

U.S. PATENT DOCUMENTS

| | | | | |
|---|---|---|---|---|
| 2007/0284580 A1* | 12/2007 | Lim .................. | H10D 30/0321 257/E21.414 |
| 2012/0146037 A1* | 6/2012 | Okabe .................. | H10D 30/674 257/E21.414 |

(Continued)

FOREIGN PATENT DOCUMENTS

| | | |
|---|---|---|
| TW | 222345 B | 4/1994 |
| TW | 200514261 A | 4/2005 |
| TW | 201100934 A | 1/2011 |

*Primary Examiner* — Mohammed R Alam

(74) *Attorney, Agent, or Firm* — ScienBiziP, P.C.

(57) ABSTRACT

The present disclosure provides a TFT. The TFT includes a gate electrode, an insulating layer on the gate electrode, and an active layer on the insulating layer. The active layer includes an annealed layer and an a-Si layer. The annealed layer is between the a-Si layer and the insulating layer. The annealed layer is made of amorphous silicon material by excimer laser annealing. The present disclosure further provides a TFT array substrate and a method of manufacturing a TFT.

3 Claims, 6 Drawing Sheets

(56) References Cited

U.S. PATENT DOCUMENTS

| | | | | |
|---|---|---|---|---|
| 2014/0097455 | A1* | 4/2014 | Ono | H10D 86/441 257/306 |
| 2018/0196294 | A1* | 7/2018 | Ishida | G02F 1/136286 |
| 2020/0064668 | A1* | 2/2020 | Liang | H10D 30/6715 |
| 2021/0193697 | A1* | 6/2021 | Kim | H10D 86/0221 |

* cited by examiner

THIN FILM TRANSISTOR, THIN FILM TRANSISTOR ARRAY SUBSTRATE AND METHOD OF MANUFACTURING THIN FILM TRANSISTOR

FIELD

The subject matter herein generally relates to the field of semiconductors, specifically a thin film transistor (TFT), a TFT array substrate and a method of manufacturing the TFT.

BACKGROUND

A mobility of a conventional TFT whose active layer consisting of amorphous silicon (a-Si) material is only 0.2 $cm^2/V*S$ to 0.5 $cm^2/V*S$. Limited by the low mobility, when the TFT is applied to products such as display panels, the charging and discharging speed is relatively slow, thereby affecting the response speed of the product.

Therefore, there is room for improvement in the art.

BRIEF DESCRIPTION OF THE DRAWINGS

Implementations of the present disclosure will now be described, by way of embodiment, with reference to the attached figures.

DETAILED DESCRIPTION

Figure 1:
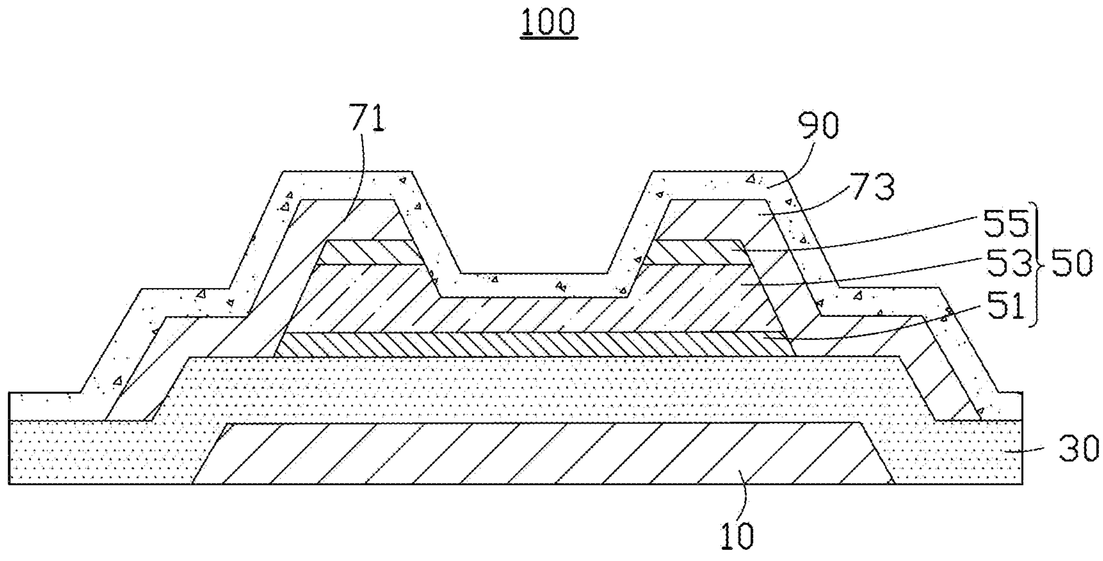
FIG. 1 is a schematic view of a TFT according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale, and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one". The term "circuit" is defined as an integrated circuit (IC) with a plurality of electric elements, such as capacitors, resistors, amplifiers, and the like.

An embodiment of the present disclosure provides a TFT. As shown in FIG. 1, the TFT 100 includes a gate electrode 10, an insulating layer 30 and an active layer 50. The insulating layer 30 is on the gate electrode 10, the active layer 50 is on a side of the insulating layer 30 away from the gate electrode 10, and the insulating layer 30 is between and insulates the active layer 50 from the gate electrode 10. The active layer 50 includes an annealed layer 51 and an amorphous silicon (a-Si) layer 53. The annealed layer 51 is on the insulating layer 30, the annealed layer 51 is between the a-Si layer 53 and the insulating layer 30. The annealed layer 51 is made of amorphous silicon material by excimer laser annealing.

Specifically, the active layer 50 includes an annealed layer 51 and an a-Si layer 53 stacked in sequence. A material of the annealed layer 51 is microcrystalline silicon or polycrystalline silicon. When a voltage is applied to the gate electrode 10, the carriers in the active layer 50 migrate, so that the active layer 50 can achieve lateral conduction. Compared with the a-Si material, the arrangement of crystal grains in microcrystalline silicon or polycrystalline silicon is more orderly, so the mobility of carriers is relatively high, but the absorption coefficient is low. The combination of the annealed layer 51 and the amorphous silicon layer 53 can form a super amorphous silicon structure, thereby improving the overall mobility.

The TFT 100 further includes a source electrode 71 and a drain electrode 73, the source electrode 71 and the drain electrode 73 are both on a side of the active layer 50 away from the insulating layer 30, and the source electrode 71 and the drain electrode 73 are spaced apart from each other.

The active layer 50 further includes an n+-type hydrogenated amorphous silicon layer (n+a-Si:H) 55, and the n+a-Si:H 55 is on a side of the a-Si layer 53 away from the annealed layer 51. The n+a-Si:H 55 is configured to form ohmic contact with the source electrode 71 and the drain electrode 73 respectively, so as to facilitate the input and output of current. Specifically, since a barrier layer is formed when a metal is in contact with an a-Si material, electrons are not easy to pass through. However, by setting the n+a-Si:H 55, that is, a-Si doped with ions, electrons can pass through the barrier layer by the tunnel effect, thereby forming a low-resistance ohmic contact.

The n+a-Si:H 55 defines a gap exposing the a-Si layer 53, the gap corresponds to the space between the source electrode 71 and the drain electrode 73, so as to avoid short circuit between the source electrode 71 and the drain electrode 73.

The gate electrode 10 is made of metal materials such as molybdenum, aluminum, titanium, copper, and the like, or alloy materials such as molybdenum-aluminum alloy, titanium-copper alloy, and the like. The gate electrode 10 is configured for receiving an external voltage to control the on-off of the TFT 100. The insulating layer 30 may be made of SiOx, SiNx, or an alternate superposition of SiOx and SiNx. The source electrode 71 and the drain electrode 73 each is made of metal materials such as molybdenum, aluminum, titanium, copper, and the like, or alloy materials such as molybdenum aluminum alloy, titanium copper alloy, and the like.

The TFT 100 further includes a film layer 90 on a side of the source electrode 71 and the drain electrode 73 away from the active layer 50. Specifically, the film layer 90 may be one or a combination of other functional structures such as an insulating layer, a planarization layer, or a protective layer.

The annealed layer 51 is formed by crystallizing an a-Si material by excimer laser annealing (ELA). Specifically, by using an excimer laser to heat the a-Si material, the a-Si material can be crystallized into microcrystalline silicon or polycrystalline silicon. During the ELA process, the a-Si material can be crystallized into microcrystalline silicon according to different environments and equipment. The excimer laser light has the best conversion effect at certain energy densities, which can achieve high conversion efficiency and produce few impurities. A range of the certain energy densities is called the optimal energy density (OED).

Figure 2:
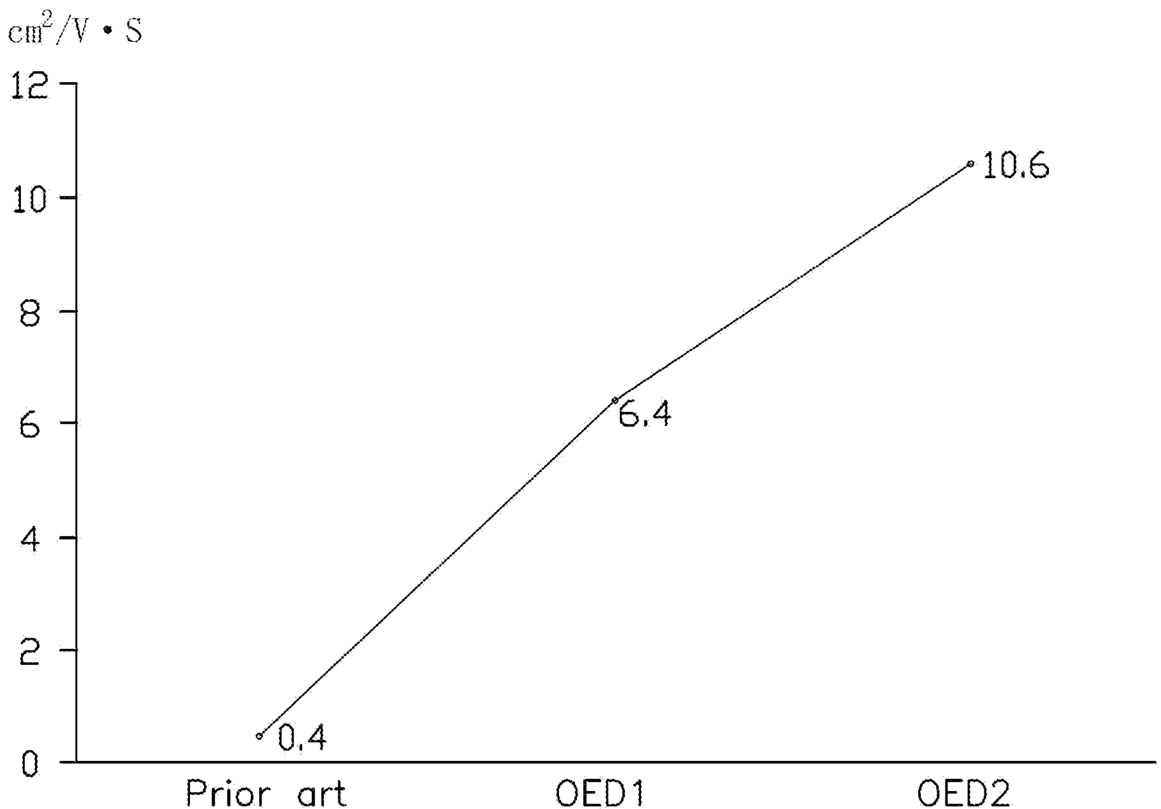
FIG. 2 is a comparison diagram of mobility between a TFT according to an embodiment of the present disclosure and a TFT in the prior art.

FIG. 2 shows the mobility of a conventional TFT and the mobility of the TFT according to an embodiment of the present disclosure under different OEDs. An active layer of the conventional TFT does not include an annealed layer (i.e., does not contain a microcrystalline layer), the mobility of the conventional TFT is 0.4 $cm^2$/V*S. The mobility of the TFT according to an embodiment of the present disclosure under OED1 is 6.4 $cm^2$/V*S, and the mobility of the TFT according to another embodiment of the present disclosure under OED2 is 10.6 $cm^2$/V*S.

That is, in some embodiments, the overall mobility of the TFT is increased by setting the annealed layer and converting the a-Si material into microcrystalline silicon or polycrystalline silicon by the ELA process. Compared with the conventional TFT whose active layer consisting of a-Si material, the mobility of the TFT in some embodiments of the present disclosure can be increased by more than ten times.

Figure 3:
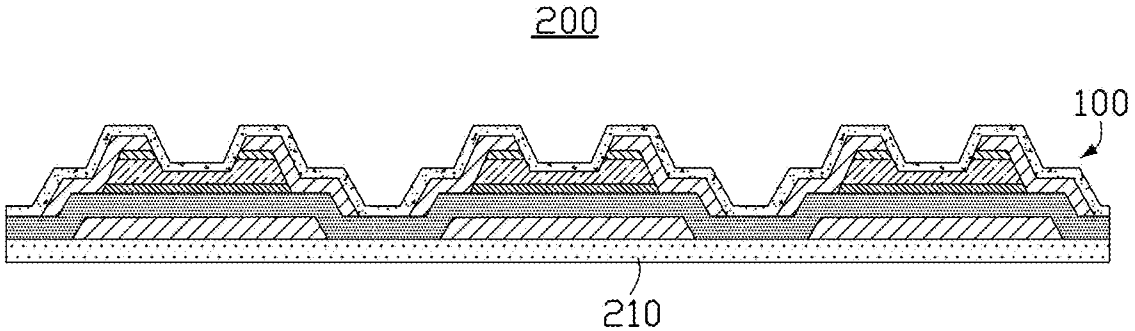
FIG. 3 is a schematic view of a TFT array substrate according to an embodiment of the present disclosure.

The embodiment of the present disclosure further provides a TFT array substrate. As shown in FIG. 3, the TFT array substrate 200 includes a substrate 210 with at least an insulating surface and a plurality of TFTs 100 formed on the insulating surface of the substrate 210 in an array of rows and columns. Each TFT 100 can be connected by a plurality of wires (not shown), so that the TFTs 100 can be scanned row-by-row.

In one embodiment, the TFT array substrate 200 can be an array substrate of a liquid crystal display panel, and the drain electrode 73 of each TFT 100 of the TFT array substrate 200 is connected to a pixel electrode for controlling the deflection of the corresponding liquid crystal in the liquid crystal layer, so as to realize the modulation of the light, and can cooperate with the backlight module and the color filter layer to realize displaying images.

In other embodiments, the TFT array substrate 200 can be an array substrate of a self-luminous display panel. Each TFT 100 is electrically connected to a light emitting diode, so as to directly control the light emitting diode to emit light, thereby realizing displaying images.

When the TFT array substrate 200 is applied to a liquid crystal display panel, the intensity of light can be modulated by energizing the TFTs 100, and the mobility of the TFTs 100 determines the modulation speed. The more the TFTs 100 in the same row on the substrate 210 are, the slower the row-by-row scanning speed will be. In the case of a fixed refresh rate, the mobility of the TFTs 100 determines the maximum number of TFTs 100 on a row, that is, the resolution of the display panel. When the resolution is fixed, the mobility of the TFTs 100 determines the maximum refresh rate of the display panel.

The TFT array substrate 200 includes the TFTs 100 with high mobility, so the TFT array substrate 200 has a high refresh rate and high resolution, thereby improving the display effect.

The embodiment of the present disclosure further provides a method of manufacturing a TFT. The method is provided by way of embodiment, as there are a variety of ways to carry out the method. The method described below can be carried out using the configurations illustrated in FIG. 1 and FIG. 5 for example, and various elements of these figures are referenced in explaining the method. Each block in this method represents one or more processes, methods, or subroutines, carried out in the method. Additionally, the illustrated order of blocks is by example only and the order of the blocks can change. The method can begin at block S1.

Figure 4:
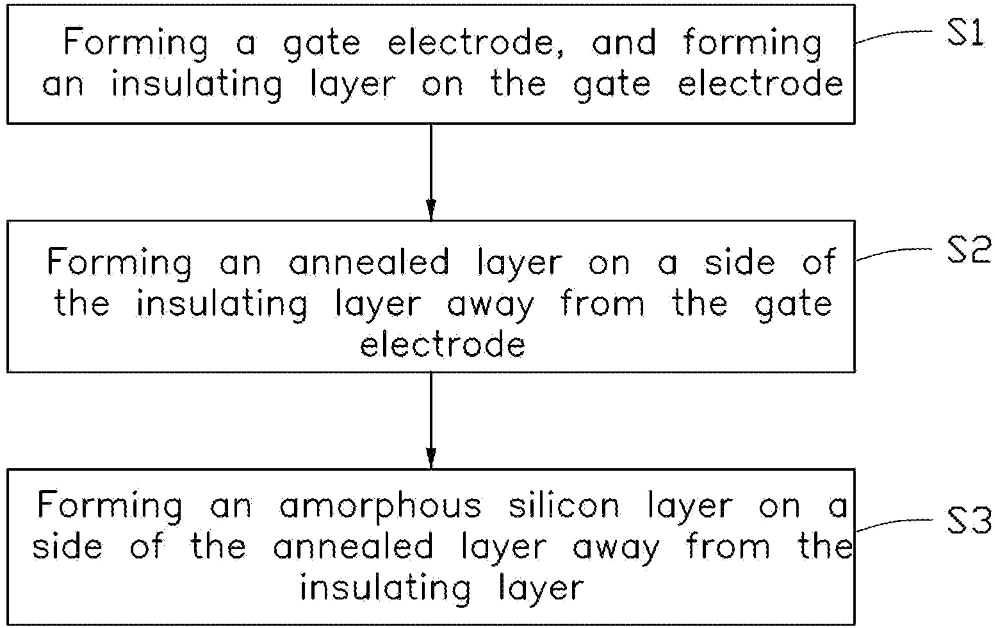
FIG. 4 is a flowchart of a method of manufacturing a TFT according to an embodiment of the present disclosure.

As shown in FIG. 4, in block S1, a gate electrode is formed, and an insulating layer is formed on the gate electrode.

In one embodiment, in block S1, the gate electrode is formed on an insulating surface of a substrate (not shown).

Figure 5:
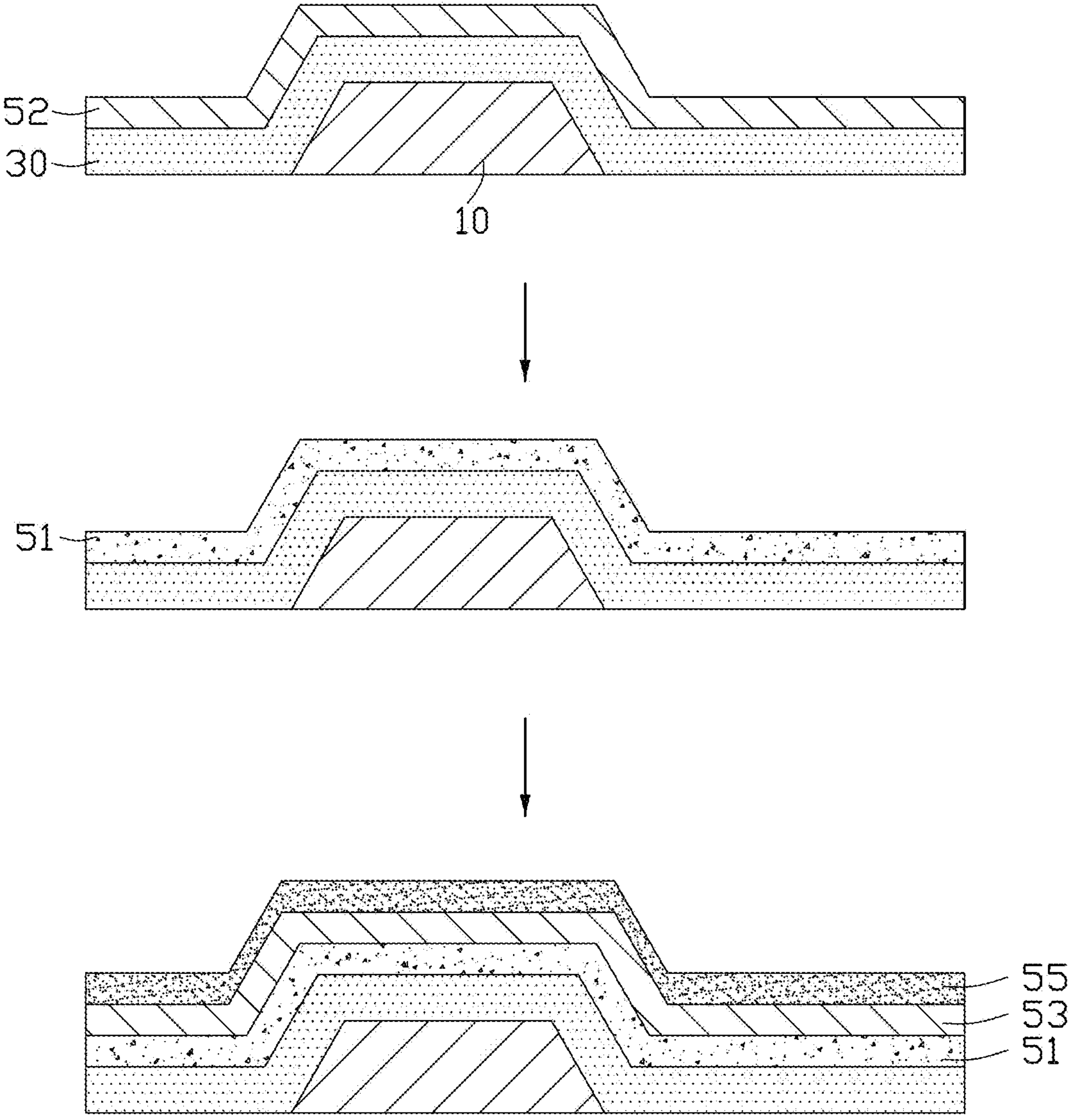
FIG. 5 is a schematic view showing blocks S2 and S3 in FIG. 4.

In one embodiment, as shown in FIG. 5, in block S2, a first a-Si layer 52 is formed on a side of the insulating layer 30 away from the gate electrode 10, and an excimer laser annealing process is performed on the first a-Si layer 52 to obtain an annealed layer.

In one embodiment, in block S2, the first a-Si layer 52 is converted into microcrystalline silicon or polycrystalline silicon to obtain the annealed layer 51. Specifically, microcrystalline silicon or polycrystalline silicon is transformed from a-Si at high temperature, and the difference lies in the difference in laser energy density in the ELA process of forming microcrystalline silicon and polycrystalline silicon. Compared with a-Si, microcrystalline silicon or polycrystalline silicon has higher mobility, which is beneficial to improve the overall mobility of the TFT.

In one embodiment, in block S2, an optimal energy density (OED) of the first a-Si layer of the ELA process is determined. Specifically, due to the error of the equipment when converting the amorphous silicon film, the OED of the laser needs to be re-determined for each annealing, so as to achieve a good crystallization effect and ensure that the formed thin film transistor has high mobility.

In one embodiment, determining the OED of the first a-Si layer during the ELA process includes adjusting energy density of laser light while performing the ELA process, and confirming whether hydrogen explosion occurs; and if no hydrogen explosion has occurred is confirmed, determining that the energy density of the laser light is at the OED. Specifically, when a laser light heats the first a-Si layer 52, a certain amount of hydrogen will be mixed, and if the energy density is not at the OED, hydrogen explosion will occur. Whether or not a hydrogen explosion has occurred can be judged by observing the color of the first a-Si layer 52. In the case of no hydrogen explosion, the first a-Si layer 52 is usually light blue, and the position where the hydrogen explosion occurs will change color to brown or other colors. By irradiating the first a-Si layer 52, it can be observed more intuitively whether hydrogen explosion occurs.

Figure 6:
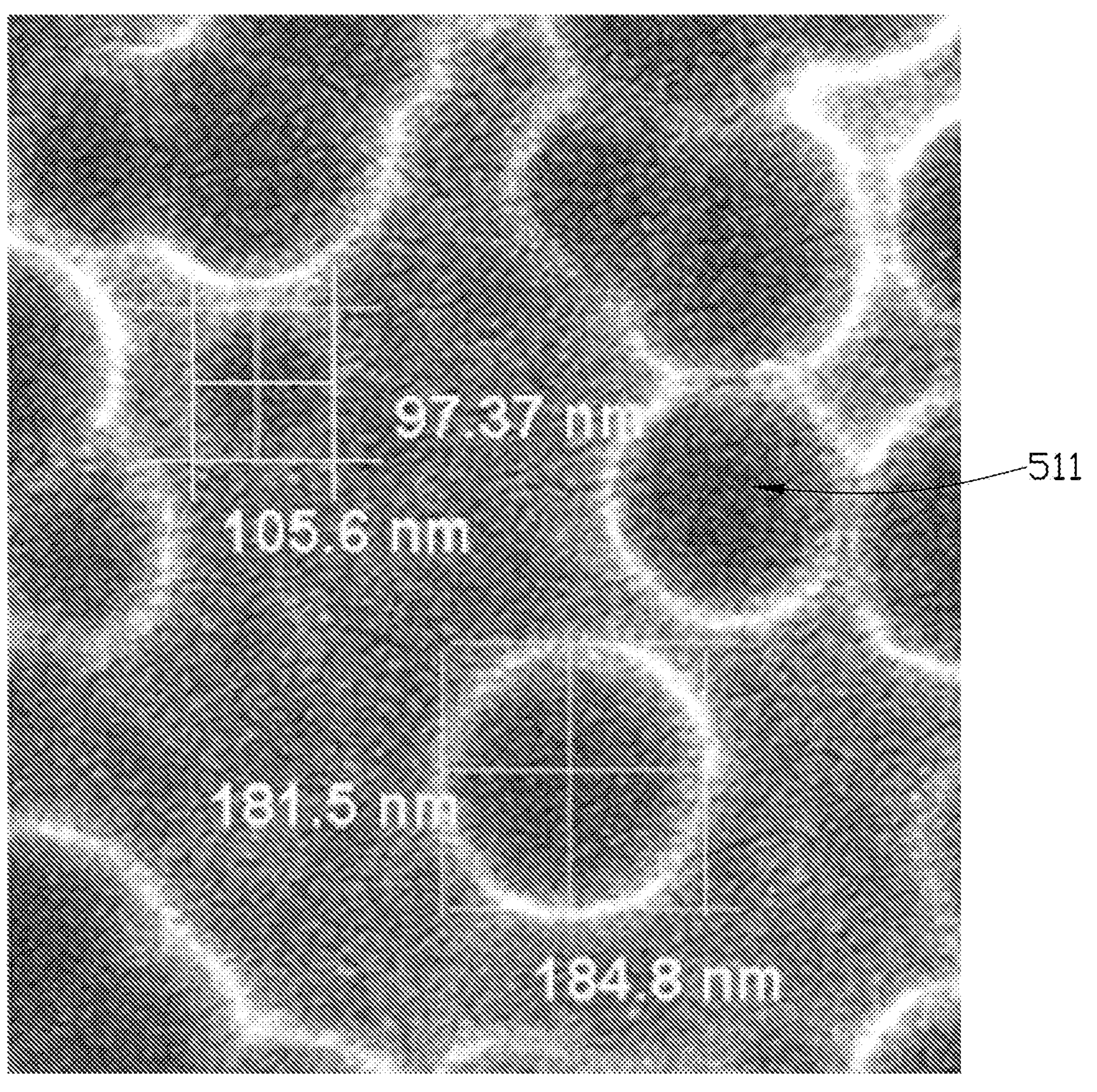
FIG. 6 is a scanning electron micrograph of the annealed layer formed by the method according to an embodiment of the present disclosure.

In one embodiment, determining the OED of the first a-Si layer during the ELA process further includes acquiring an image of grains of the annealed layer after performing the ELA process, and if an average size of the grains is in a range of 100 nm to 180 nm, then determining that energy density of laser light during the ELA process is at the OED. Specifically, the purpose of the ELA process is to convert irregularly arranged a-Si into microcrystalline silicon or polycrystalline silicon, and the size of the grains 511 (shown in FIG. 6) of microcrystalline silicon or polycrystalline silicon is usually between 100 nm to 180 nm. Therefore, it can be directly judged whether the ELA process is at the OED by acquiring the image of the grains 511. Acquiring the image of the grains 511 may be acquired by a scanning electron microscope (SEM) or an atomic force microscope (AFM).

In one embodiment, to determine the OED of the first a-Si layer during the ELA process, it is necessary to perform the above-mentioned confirmation of whether hydrogen explosion occurs and the measurement of the size of the grains 511, so as to obtain a more accurate OED. Specifically, the OED obtained by confirming that hydrogen explosion does not occur may be in range A, and the OED obtained by confirming that the average size of the grains is in a range of 100 to 180 nm may be in range B, and the intersection of the range A and the range B is the more accurate OED.

In block S3, a second a-Si layer is formed on a side of the annealed layer away from the insulating layer.

In one embodiment, as shown in FIG. 5, the method further includes forming an n+a-Si:H 55 on a side of the second a-Si layer 53 away from the annealed layer 51. Specifically, the n+a-Si:H 55 is used to form an ohmic contact with the metal material, so as to facilitate the input and output of current.

In one embodiment, after forming the n+a-Si:H 55, the method further forming a source electrode 71 and a drain electrode 73 spaced apart from each other on a side of the n+a-Si:H 55 away from the second a-Si layer 53, and etch the exposed part of the n+a-Si:H 55 between the source electrode 71 and the drain electrode 73, thereby forming a channel.

In one embodiment, both the first a-Si layer 52 and the second a-Si layer 53 are formed by chemical vapor deposition. The method provided in the present disclosure can manufacture a plurality of TFTs 100 at the same time, so as to directly form an array of TFTs.

In the method provided in the present disclosure, the first a-Si layer 52 is provided first, the first a-Si layer 52 is converted into the annealed layer 51 by the ELA process, and then the second a-Si layer 53 is formed to form a super a-Si layer structure, thereby increasing the mobility of the TFT 100 more than ten times. When the TFT 100 is applied to a display panel, the performance of the display panel can be improved.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. A method of manufacturing a thin film transistor (TFT), the method comprising:

forming a gate electrode, and forming an insulating layer on the gate electrode;

forming a first amorphous silicon (a-Si) layer on a side of the insulating layer away from the gate electrode;

performing an excimer laser annealing (ELA) process on the first a-Si layer to obtain an annealed layer; and forming a second a-Si layer on a side of the annealed layer away from the insulating layer;

wherein performing the ELA process further comprises determining an optimum energy density (OED) of the first a-Si layer, determining the OED of the first a-Si layer; and adjusting energy density of laser light;

the method further comprises:

acquiring an image of grains of the annealed layer after performing the ELA process; and in case that an average size of the grains is in a range of 100 nm to 180 nm, determining that energy density of laser light during the ELA process is at the OED; and confirming whether hydrogen explosion occurs during the ELA process; and in case that no hydrogen explosion during the ELA process has occurred is confirmed, determining that the energy density of the laser light is at the OED.

2. The method according to claim 1, wherein performing the ELA process comprises crystallizing the first a-Si layer into microcrystalline silicon or polycrystalline silicon.

3. The method according to claim 1, further comprising forming an n+-type hydrogenated amorphous silicon (n+a-Si:H) layer on a side of the second a-Si layer away from the annealed layer.

* * * * *